(12) United States Patent
McKay

(10) Patent No.: US 10,224,916 B1
(45) Date of Patent: Mar. 5, 2019

(54) COMPARATOR HAVING DUPLICATE ALTERNATELY USED TRANSISTORS

(71) Applicant: GLOBALFOUNDRIES INC., Grand Cayman (KY)

(72) Inventor: Thomas G. McKay, Boulder Creek, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/933,579

(22) Filed: Mar. 23, 2018

(51) Int. Cl.
  *H03K 5/22* (2006.01)
  *H03K 5/24* (2006.01)
  *H03F 3/45* (2006.01)

(52) U.S. Cl.
  CPC ....... *H03K 5/2481* (2013.01); *H03F 3/45717* (2013.01)

(58) Field of Classification Search
  None
  See application file for complete search history.

(56) References Cited

U.S. PATENT DOCUMENTS

| | | | |
|---|---|---|---|
| 5,497,347 A | 3/1996 | Feng | |
| 5,689,228 A | 11/1997 | Yetter et al. | |
| 5,841,712 A | 11/1998 | Wendell et al. | |
| 6,014,097 A | 1/2000 | Brandt | |
| 7,196,552 B2 * | 3/2007 | Zhou | H03K 5/2481 327/307 |
| 8,513,980 B2 | 8/2013 | Payne et al. | |
| 2006/0132191 A1 * | 6/2006 | Palmer | G11C 7/1078 327/52 |

OTHER PUBLICATIONS

Van der Wel et al., "Low-Frequency Noise Phenomena in Switched MOSFETs," IEEE Journal of Solid-State Circuits, vol. 42, No. 3, 2007, pp. 540-550.
Mahmutoglu et al., "Analysis of Low-Frequency Noise in Switched MOSFET Circuits: Revisited and Clarified," IEEE Transactions on Circuits and Systems-I, vol. 62, No. 4, 2015, pp. 929-937.
Otto et al., "Mass Data Analysis of Random Telegraph Noise in 22nm FDSOI Back Biased Transistors," GlobalFoundries Fab1 LLC & Co. KG, Dresden, Germany, pp. 1-2.

(Continued)

*Primary Examiner* — Long Nguyen
(74) *Attorney, Agent, or Firm* — Gibb & Riley, LLC; David A. Cain, Esq.

(57) ABSTRACT

Comparators include (among other components) two inputs, an output, and two pairs of transistors (each connected to a different one of the inputs). Both pairs of transistors are connected to the output. Additionally, a first signal generator is connected to the first transistor in each of the pairs of transistors, and a second signal generator is connected to the second transistor in each of the pairs of transistors. The first signal generator and the second signal generator output on/off control signals that have timing patterns that are inverted relative to one another, and this causes only the first transistor or the second transistor in each of the pairs of transistors to be active at any given time. Thus, the single active transistor in the first pair of transistors and the single active transistor in the second pair of transistors amplify the difference between the two inputs, through the output.

20 Claims, 4 Drawing Sheets

(56) References Cited

OTHER PUBLICATIONS

Sukegawa et al., "A ¼-inch 8Mpixel Back-Illuminated Stacked CMOS Image Sensor", IEEE International Solid-State Circuits Conference (ISSCC), 2013, pp. 484-485.

Drake et al., "Random Dopants and Low-Frequency Noise Reduction in Deep-Submicron MOSFET Technology," Dissertation, Oregon State University, 2011, pp. 1-163.

* cited by examiner

COMPARATOR HAVING DUPLICATE ALTERNATELY USED TRANSISTORS

BACKGROUND

Field of the Invention

The present disclosure relates to comparators (operational amplifiers), and more specifically, to comparators having duplicate, alternately used, transistors.

Description of Related Art

Integrated circuit devices, such as imaging devices, use transistors for many different functions, and these transistors can take many different forms, from planar transistors, to vertical transistors, to transistors that use a "fin" style structure. For example, imaging devices connected to pixel arrays generally use pairs of transistors to form comparators, and such comparators are used in combination with a clock signal to record information from the pixel array into latches.

However, such comparators can sometimes produce erroneous signals. For example, in steady-state channel inversion, random time step-patterns in the signals output by the comparators can occur. Physically, this can be due to only a few deep-energy-level traps in the transistors of the comparator. Relatively long spacing between such step-patterns can be observed, and these step-patterns are sometimes referred to as Random Telegraph Noise (RTN). One well-known way to improve RTN is through defect reduction in the fabrication process of the transistors used in the comparators.

SUMMARY

Devices herein include an imager (e.g., image sensor device) that has, among other components a pixel array, comparators, counters, latches, etc. The pixel array can be, for example, an array of complementary metal oxide semiconductor (CMOS) sensors. The comparators can be operational amplifier-type comparators that are electrically connected to, and receive output from, the pixel array. The counters are electrically connected to, and receive output from, the comparators. The counters digitally sample the output from the comparators and produce digital output. The latches are electrically connected to, and receive the digital output from, the counter.

The comparators used herein include (among other components) two inputs, an output, and two pairs of transistors. A first pair of the transistors is connected to a first input of the two inputs, and a second pair of the transistors is connected to the second input. Both pairs of transistors are connected to the output. Additionally, a first signal generator is connected to the first transistor in each of the pairs of transistors, and a second signal generator is connected to the second transistor in each of the pairs of transistors. More specifically, the first and second signal generators are connected to the back gates of the transistors in the pairs of transistors.

The first signal generator and the second signal generator output on/off control signals that have timing patterns that are inverted relative to one another, and this causes only the first transistor or the second transistor in each of the pairs of transistors to be active at any given time (with a small amount of overlap). Thus, the single active transistor in the first pair of transistors and the single active transistor in the second pair of transistors amplify the difference between the two inputs, through the output. In other words, the on/off control signals cause only the first transistor or the second transistor to be active in the first pair of transistors at any given time, and only the first transistor or the second transistor to be active in the second pair of transistors at any given time.

Also, the first signal generator and the second signal generator output the on/off control signals offset relative to another, and this causes at least two of the four transistors (one in the first pair of transistors and one the second pair of transistors) to be active at a time. The offset is equal to the amount of time needed for the transistors to transition from an inactive state to an active state.

The transistors in the first pair of transistors and the second pair of transistors can have undesirable charge traps that accumulate charges over a "charge accumulation time period." These trap or "malfunction" charges cause the transistors to malfunction, but the first signal generator and the second signal generator only continuously output the "on" signal for less time than the charge accumulation time period. Thus, the on/off control signals provide a ground connection at intervals separated by less than the charge accumulation time period, and this periodically discharges the charge traps to ground (at intervals less time than the charge accumulation time period), which thereby prevents the malfunction charges from accumulating in the charge traps and prevents RTN.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
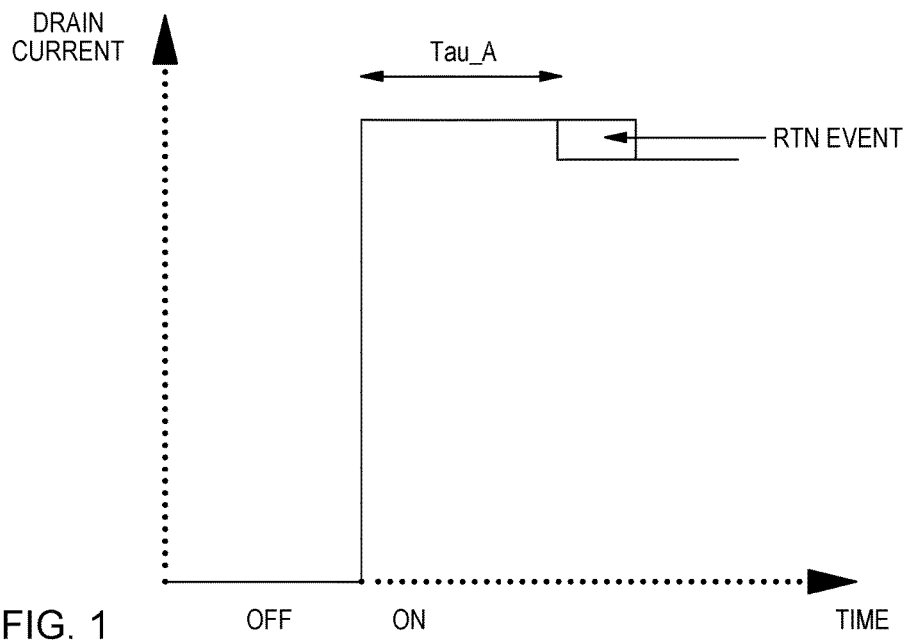
FIG. 1 is a schematic diagram illustrating the occurrence of an RTN event.

As mentioned above, comparators can sometimes produce erroneous signals, such as step-patterns that are sometimes referred to as Random Telegraph Noise (RTN). FIG. 1 is a graph that illustrates an RTN event. More specifically, transistor drain current is shown on the left axis, and time is shown on the bottom axis. As can be seen in FIG. 1, an unexpected step decrease of the drain current occurs when there is an RTN event. One well-known way to improve RTN is through defect improvements in the fabrication process of the transistors used in the comparators.

In contrast, this disclosure demonstrates that the RTN impact of comparator operation can be reduced using time-multiplexing devices (devices used alternatively in a "ping-pong" or "round-robin" operation) that turn off unused devices to empty their traps, at intervals shorter than the time required for the traps to accumulate charge, thereby preventing erroneous signals such as RTN.

Since imager sampling time windows are reducing, it is possible to keep a device active long enough for the comparator operation, but too short for traps to capture electrons on a statistically significant basis. The devices described herein shut off comparator transistors at the back gate to ping-pong or round-robin the duty cycle of the active transistors, which results in a comparator with lower impact from RTN. Moreover, this makes size reduction possible because RTN is one of the drivers for device sizing in imager comparators.

Figure 2:
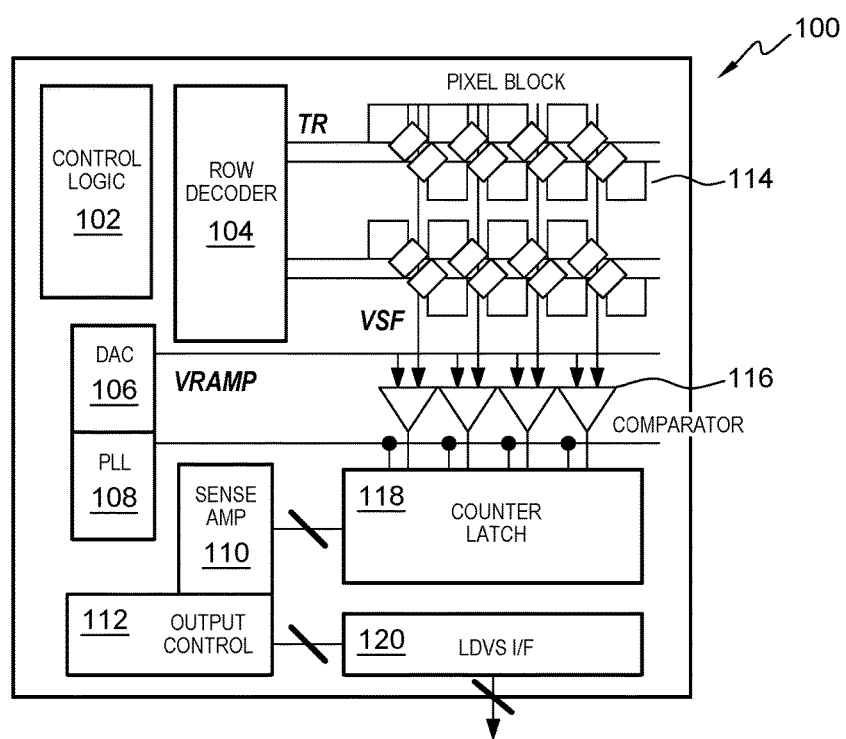
FIG. 2 is a schematic diagram illustrating an imaging device according to embodiments herein.

As shown in FIG. 2, devices herein include an imager (e.g., image sensor device or imager device) 100 that has, among other components a logic controller 102, a row decoder 104, a digital to analog converter (DAC) 106, a phase-locked loop (PLL) 108, a sense amplifier 110, an output control 112, a pixel array 114, comparators 116, counters and latches 118, a low voltage digital signal interface (LVDS I/F) 120, etc. The pixel array 114 can be, for example, an array of complementary metal oxide semiconductor (CMOS) sensors. The comparators 116 can be operational amplifier-type comparators 116 that are electrically connected to, and receive output from, the pixel array 114. The counters 118 are electrically connected to, and receive output from, the comparators 116. The counters 118 digitally sample the output from the comparators 116 and produce digital output. The latches 118 are electrically connected to, and receive the digital output from, the counter 118.

Figure 3:
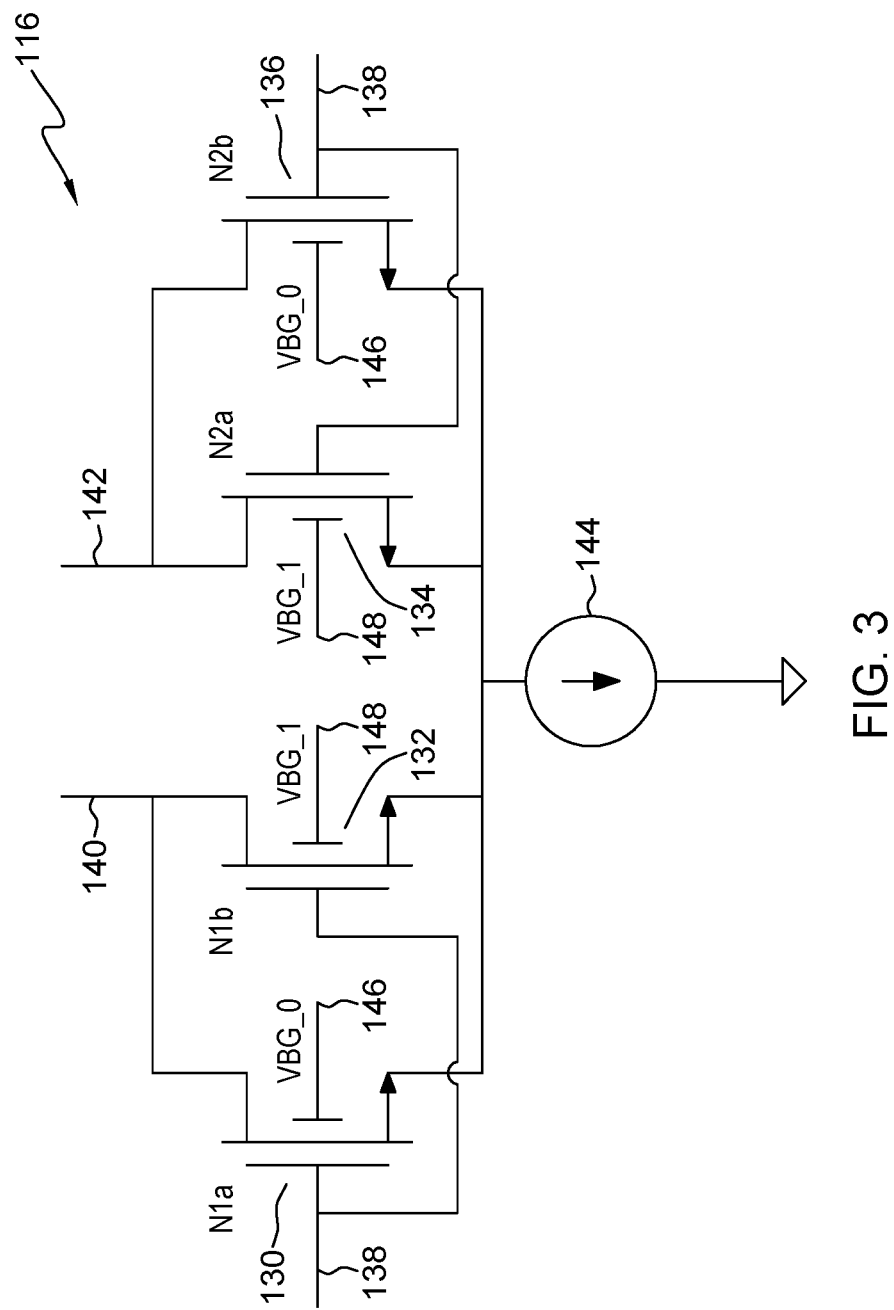
FIG. 3 is a schematic diagram illustrating a comparator included within the imaging device shown in FIG. 2.

As shown in FIG. 3, the comparators 116 disclosed herein include (among other components) two signal inputs 140, 142, voltage inputs 138, an output 144, a first pair of transistors 130, 132 (N1a, N1b) connected to a first input of the two inputs 140, 142, and a second pair of transistors 134, 136 (N2a, N2b) connected to the second input of the two inputs 140, 142. Both the first pair of transistors 130, 132 and the second pair of transistors 134, 136 are connected to the output 144.

Additionally, devices that are generically referred to as "signal generators" are included in the illustration shown in FIG. 3. These signal generators produce on/off control signals; however, these signal generators are not necessarily discrete devices, but instead are any component or controller that can generate signals (e.g., an oscillator, etc.) and the concept of signal generators is only presented here for convenience of illustration and discussion. These signal generators include first signal generator(s) 146 (two of which are shown in the example in FIG. 3) that is/are connected to the first transistor (130 and 136) in each of the pairs of transistors, and second signal generator(s) 148 that is/are connected to the second transistor (132 and 134) in each of the pairs of transistors. More specifically, the first and second signal generators 146, 148 are connected to the back gates of the transistors 130-136.

Figure 4:
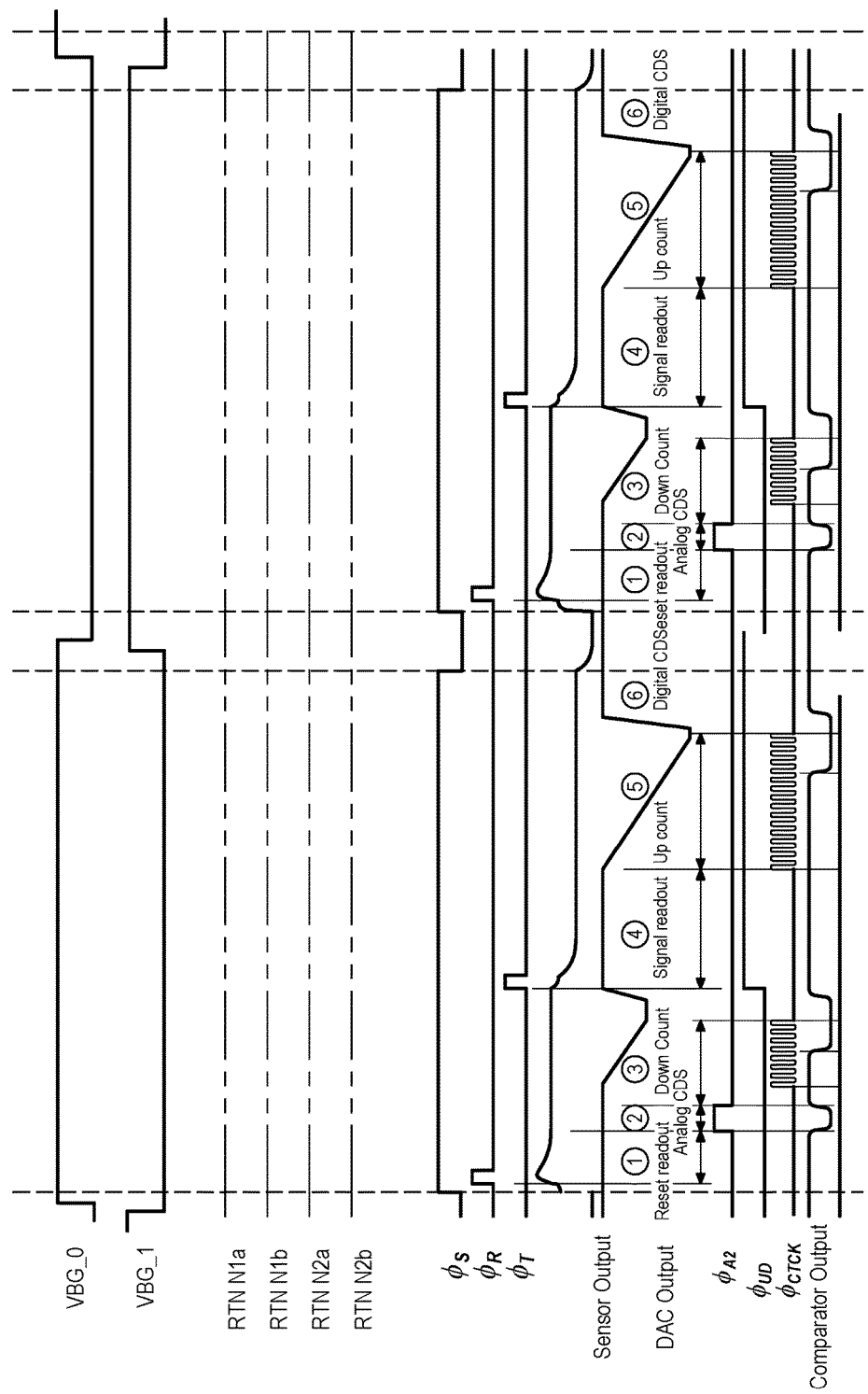
FIG. 4 is a Signal timing diagram produced by the imaging device shown in FIG. 2.

As shown in FIG. 4, the first signal generator 146 and the second signal generator 148 output 144 on/off control signals VBG_0 and VBG_1 that have timing patterns that are inverted relative to one another, and this causes only the first transistor (130 and 136) or the second transistor (132 and 134) in each of the pairs of transistors to be active at any given time. Thus, the single active transistor in the first pair of transistors (130 or 132) and the single active transistor in the second pair of transistors (134 or 136) amplify the difference between the two inputs 140, 142, through the output 144. In other words, the on/off control signals VBG_0 and VBG_1 cause only the first transistor 130 or the second transistor 132 to be active in the first pair of transistors 130, 132 at any given time; and only the first transistor 136 or the second transistor 134 to be active in the second pair of transistors 134, 136 at any given time.

Also as shown in FIG. 4, the first signal generator 146 and the second signal generator 148 output 144 the on/off control signals VBG_0 and VBG_1 offset relative to another, and this causes at least two of the four transistors (in the first pair of transistors 130, 132 and the second pair of transistors 134, 136) to be active at a time. The offset is equal to the amount of time needed for the transistors in the first pair of transistors 130, 132 and the second pair of transistors 134, 136 to transition from an inactive state to an active state.

The transistors in the first pair of transistors 130, 132 and the second pair of transistors 134, 136 can have undesirable charge traps that accumulate charges over a "charge accumulation time period." These trap or "malfunction" charges cause the transistors to malfunction, but the first signal generator 146 and the second signal generator 148 only continuously output 144 the "on" signal for less time than the charge accumulation time period. Thus, the on/off control signals provide a ground connection at intervals separated by less than the charge accumulation time period, and this periodically discharges the charge traps to ground (at intervals less time than the charge accumulation time period), which thereby prevents a sufficient magnitude of the malfunction charges from accumulating in the charge traps to cause RTN. Thus, as shown in FIG. 4, there is no RTN, as each of N1a, N1b, N2a, and N2b remain stable without any drops that would produce RTN.

Therefore, the comparators 116 used within imaging devices 100 herein include twice as many transistors as are needed to perform a conventional comparator operation. However, these devices constantly (and alternately) shut off half of the transistors 130-136 by connecting the back gates of the inactive transistors 130-136 to ground, which allows any charges that have accumulated within traps of the transistors 130-136 to dissipate. Further, the signal generators 146, 148 alternate which transistors 130-136 are shut off during intervals that are short enough to prevent any of the traps from accumulating sufficient charge to cause an RTN event. However, because half of the transistors 130-136 are always active within the comparators 116, the comparators 116 operate as any conventional comparator would operate (but, without producing RTN events).

For example, it may take a known amount of time (e.g., 7-10 μs) to obtain imaging data from a column of pixels; however, it may take much longer (e.g., 3×, 5×, 10×, etc.) for charges within transistor traps to accumulate sufficiently to produce an RTN event. The structures herein take advantage of this time differential by switching which transistors 130-136 are active within the comparators 116 for each column sensing operation. Therefore, by switching transistors 130-136 each time in a different column is to be sensed, each of the transistors 130-136 is connected to ground (and is discharged) at much smaller time intervals than would be needed for the traps to accumulate sufficient charge to produce an RTN event. While some examples herein describe that the active transistors within the comparator may be switched every column sensing operation, in alternative embodiments, the switching can occur less frequently (e.g., every 2, 4, 6, etc., columns sensing operations) so long as the transistors are connected to ground at much smaller time intervals than would be needed for the traps to accumulate sufficient charge to produce an RTN event.

This also makes the structures herein especially applicable to complementary metal oxide semi conductor (CMOS) pixel arrays, because such devices operate within very short time frames. With such shorter time frames, the traps of the transistors within the comparators can be discharged at shorter time intervals, thereby substantially decreasing the likelihood that any of the traps of the transistors will accumulate charges, which in turn substantially decreases the likelihood of any RTN events.

Additionally, FIG. 4 illustrates the various operations that the image sensor device) 100 performs. More specifically, as shown in FIG. 4, with the start or system signal øS high, the reset signal øR resets the pixels causing the reset level of the Sensor Output to appear at the pixel output (as shown in region 1 above the DAC Output in FIG. 4). After that, an analog CDS is performed, as controlled by the øAZ or auto zero signal (as shown in region 2 above the DAC Output in FIG. 4). Next, the actual output signal is digitally sampled, as shown in region 3 above the DAC Output in FIG. 4, where the clock signal øCTCK becomes active for the sampling process. The signal readout occurs in region 4 above the DAC Output in FIG. 4, as controlled by the øUD signal. The up count occurs (in region 5 above the DAC Output in FIG. 4) where the clock signal øCTCK becomes active; after which (as shown in region 6 above the DAC Output in FIG. 4) the digital CDS occurs.

This initial sensing cycle described in the previous paragraph, and occurring on the left side of FIG. 4, is performed using only the comparator transistors connected to first signal generator 146, which are the transistors receiving control signals VBG_0 (e.g., first transistor (130 and 136) of each pair). For the next otherwise identical sensing cycle, occurring on the right side of FIG. 4, the exact same processing is performed using only the comparator transistors connected to second signal generator 148, which are the transistors receiving control signals VBG_1 (e.g., second transistor (132 and 134) of each pair). This alternatively shuts off the comparator transistors every other sensing cycle, keeping such transistors activated for less time than is required to build up malfunction charges in any traps (less time than the charge accumulation time period), which eliminates the possibility of RTN from the comparator transistors.

Figure 5:
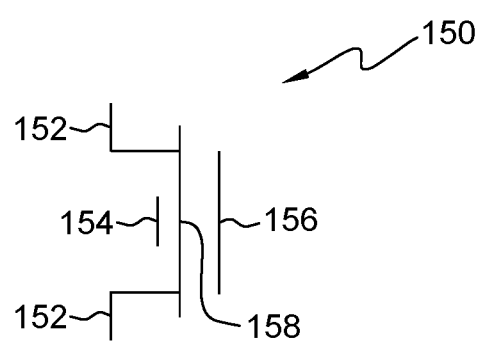
FIG. 5 is a schematic diagram illustrating a transistor of the comparator included within the imaging device shown in FIG. 2.

FIG. 5 illustrates one of the transistors 150 shown in FIG. 3, discussed above, schematically. As would be understood by those skilled in the art, the transistor 150 could be any form of transistor, whether currently known, or developed in the future (e.g., planar transistors, vertical transistors, fin-based transistors, etc.). The transistors include source/drain regions 152, a semiconductor channel region 158 between the source/drain regions 152, a front gate 158, and a back gate 154 adjacent to the channel region 158. Voltage in the front gate 158 changes the conductivity of the semiconductor channel region 158, allowing current to flow between the source/drain regions 152.

Voltage applied to the back gate 154 can adjust the voltage threshold (applied to the front gate 158) at which the transistor's conductivity changes; and relatively high voltage (or lack thereof) applied to the back gate 154 can also effectively turn on/off the transistor. As noted above, the transistors 130-136 are periodically turned off by applying relatively low or ground voltage to the back gate 154 of each of the transistors 130-136. Again, as discussed above, this allows any charge that has accumulated within traps present within the transistors 130-136 to dissipate before the charge level within the traps reaches a magnitude sufficient to create an RTN event.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

Often complimentary (opposite polarity, e.g., P vs. N) transistors are utilized in the devices described above. A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements).

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A comparator comprising:
   two inputs and an output;
   a first pair of transistors connected to a first input of the two inputs;
   a second pair of transistors connected to a second input of the two inputs, wherein the first pair of transistors and the second pair of transistors are connected to the output;
   a first signal generator connected to a first transistor in each of the first pair of transistors and the second pair of transistors; and
   a second signal generator connected to a second transistor in each of the first pair of transistors and the second pair of transistors,
   wherein the first signal generator and the second signal generator output on/off control signals having timing patterns that are inverted relative to one another, causing only one of the first transistor or the second transistor in each of the first pair of transistors and the second pair of transistors to be active at a time, and
   wherein one active transistor in the first pair of transistors and one active transistor in the second pair of transistors amplify the difference between the two inputs, through the output.

2. The comparator according to claim 1, wherein the first signal generator and the second signal generator output the on/off control signals offset relative to another, causing at least two of four transistors in the first pair of transistors and the second pair of transistors to be active at a time.

3. The comparator according to claim 2, wherein the offset is equal to an amount of time for transistors in the first pair of transistors and the second pair of transistors to transition from an inactive state to an active state.

4. The comparator according to claim 1, wherein the on/off control signals cause:
   only the first transistor or the second transistor to be active in the first pair of transistor at any given time; and
   only the first transistor or the second transistor to be active in the second pair of transistor at any given time.

5. The comparator according to claim 1, wherein the first signal generator and the second signal generator are connected to back gates of transistors in the first pair of transistors and the second pair of transistors.

6. The comparator according to claim 1, wherein transistors in the first pair of transistors and the second pair of transistors have charge traps that accumulate malfunction charges over a charge accumulation time period, wherein the malfunction charges cause the transistors to malfunction, and wherein the first signal generator and the second signal generator continuously output an on signal for less time than the charge accumulation time period.

7. The comparator according to claim 6, wherein the on/off control signals provide a ground connection at intervals less than the charge accumulation time period, periodically discharging the charge traps to ground at intervals less time than the charge accumulation time period, and preventing the malfunction charges from accumulating in the charge traps.

8. An imaging device comprising:
   a pixel array;
   a comparator electrically connected to, and receiving output from, the pixel array;
   a counter electrically connected to, and receiving output from, the comparator, wherein the counter digitally samples the output from the comparator and produces digital output; and
   latches electrically connected to, and receiving the digital output from, the counter,
   wherein said comparator comprises:
      two inputs and an output;
      a first pair of transistors connected to a first input of the two inputs;
      a second pair of transistors connected to a second input of the two inputs, wherein the first pair of transistors and the second pair of transistors are connected to the output;
      a first signal generator connected to a first transistor in each of the first pair of transistors and the second pair of transistors; and
      a second signal generator connected to a second transistor in each of the first pair of transistors and the second pair of transistors,
   wherein the first signal generator and the second signal generator output on/off control signals having timing patterns that are inverted relative to one another, causing only one of the first transistor or the second transistor in each of the first pair of transistors and the second pair of transistors to be active at a time, and
   wherein one active transistor in the first pair of transistors and one active transistor in the second pair of transistors amplify the difference between the two inputs, through the output.

9. The imaging device according to claim 8, wherein the first signal generator and the second signal generator output the on/off control signals offset relative to another, causing at least two of four transistors in the first pair of transistors and the second pair of transistors to be active at a time.

10. The imaging device according to claim 9, wherein the offset is equal to an amount of time for transistors in the first pair of transistors and the second pair of transistors to transition from an inactive state to an active state.

11. The imaging device according to claim 8, wherein the on/off control signals cause:
    only the first transistor or the second transistor to be active in the first pair of transistors at any given time; and
    only the first transistor or the second transistor to be active in the second pair of transistors at any given time.

12. The imaging device according to claim 8, wherein the first signal generator and the second signal generator are connected to back gates of transistors in the first pair of transistors and the second pair of transistors.

13. The imaging device according to claim 8, wherein transistors in the first pair of transistors and the second pair of transistors have charge traps that accumulate malfunction charges over a charge accumulation time period, wherein the malfunction charges cause the transistors to malfunction, and wherein the first signal generator and the second signal generator continuously output an on signal for less time than the charge accumulation time period.

14. The imaging device according to claim 13, wherein the on/off control signals provide a ground connection at intervals less than the charge accumulation time period, periodically discharging the charge traps to ground at intervals less time than the charge accumulation time period, and preventing the malfunction charges from accumulating in the charge traps.

15. An imaging device comprising:
a pixel array comprising complementary metal oxide semiconductor (CMOS) sensors;
an operational amplifier comparator electrically connected to, and receiving output from, the pixel array;
a counter electrically connected to, and receiving output from, the comparator, wherein the counter digitally samples the output from the operational amplifier comparator and produces digital output; and
latches electrically connected to, and receiving the digital output from, the counter,
wherein said operational amplifier comparator comprises:
two inputs and an output;
a first pair of transistors connected to a first input of the two inputs;
a second pair of transistors connected to a second input of the two inputs, wherein the first pair of transistors and the second pair of transistors are connected to the output;
a first signal generator connected to a first transistor in each of the first pair of transistors and the second pair of transistors; and
a second signal generator connected to a second transistor in each of the first pair of transistors and the second pair of transistors,
wherein the first signal generator and the second signal generator output on/off control signals having timing patterns that are inverted relative to one another, causing only one of the first transistor or the second transistor in each of the first pair of transistors and the second pair of transistors to be active at a time, and
wherein one active transistor in the first pair of transistors and one active transistor in the second pair of transistors amplify the difference between the two inputs, through the output.

16. The imaging device according to claim 15, wherein the first signal generator and the second signal generator output the on/off control signals offset relative to another, causing at least two of four transistors in the first pair of transistors and the second pair of transistors to be active at a time.

17. The imaging device according to claim 16, wherein the offset is equal to an amount of time for transistors in the first pair of transistors and the second pair of transistors to transition from an inactive state to an active state.

18. The imaging device according to claim 15, wherein the on/off control signals cause:
only the first transistor or the second transistor to be active in the first pair of transistors at any given time; and
only the first transistor or the second transistor to be active in the second pair of transistors at any given time.

19. The imaging device according to claim 15, wherein the first signal generator and the second signal generator are connected to back gates of transistors in the first pair of transistors and the second pair of transistors.

20. The imaging device according to claim 15, wherein transistors in the first pair of transistors and the second pair of transistors have charge traps that accumulate malfunction charges over a charge accumulation time period, wherein the malfunction charges cause the transistors to malfunction, and wherein the first signal generator and the second signal generator continuously output an on signal for less time than the charge accumulation time period.

* * * * *

UNITED STATES PATENT AND TRADEMARK OFFICE
CERTIFICATE OF CORRECTION

PATENT NO.        : 10,224,916 B1
APPLICATION NO.   : 15/933579
DATED             : March 5, 2019
INVENTOR(S)       : Thomas G. McKay Page 1 of 1

It is certified that error appears in the above-identified patent and that said Letters Patent is hereby corrected as shown below:

In the Specification

Column 5, Lines 40-51 should read:
FIG. 5 illustrates one of the transistors 150 shown in FIG. 3, discussed above, schematically. As would be understood by those skilled in the art, the transistor 150 could be any form of transistor, whether currently known, or developed in the future (e.g., planar transistors, vertical transistors, finbased transistors, etc.). The transistors include source/drain regions 152, a semiconductor channel region 158 between the source/drain regions 152, a front gate 156, and a back gate 154 adjacent to the channel region 158. Voltage in the front gate 156 changes the conductivity of the semiconductor channel region 158, allowing current to flow between the source/drain regions 152.

Column 5, Lines 52-63 should read:
Voltage applied to the back gate 154 can adjust the voltage threshold (applied to the front gate 156) at which the transistor's conductivity changes; and relatively high voltage (or lack thereof) applied to the back gate 154 can also effectively turn on/off the transistor. As noted above, the transistors 130-136 are periodically turned off by applying relatively low or ground voltage to the back gate 154 of each of the transistors 130-136. Again, as discussed above, this allows any charge that has accumulated within traps present within the transistors 130-136 to dissipate before the charge level within the traps reaches a magnitude sufficient to create an RTN event.

Signed and Sealed this
Thirtieth Day of April, 2019

Andrei Iancu
*Director of the United States Patent and Trademark Office*